United States Patent [19]

Rivoir et al.

[11] Patent Number: 5,703,588
[45] Date of Patent: Dec. 30, 1997

[54] DIGITAL TO ANALOG CONVERTER WITH DUAL RESISTOR STRING

[75] Inventors: Roberto Rivoir, Bari; Franco Maloberti, Torre d'Isola; Guido P. Torelli, Sant'Allesio con Vialone, all of Italy

[73] Assignee: Atmel Corporation, San Jose, Calif.

[21] Appl. No.: 730,592

[22] Filed: Oct. 15, 1996

[51] Int. Cl.⁶ ..................................................... H03M 1/78
[52] U.S. Cl. ......................... 341/159; 341/154; 341/145; 341/118
[58] Field of Search ........................... 341/145, 154, 341/153, 118

[56] References Cited

U.S. PATENT DOCUMENTS

| | | | |
|---|---|---|---|
| 4,539,553 | 9/1985 | Takeda et al. | 340/347 |
| 4,543,560 | 9/1985 | Holloway | 340/347 |
| 5,019,821 | 5/1991 | Sugimoto | 341/156 |
| 5,059,978 | 10/1991 | Valdenaire | 341/145 |
| 5,093,661 | 3/1992 | Tanimoto | 341/144 |
| 5,126,740 | 6/1992 | Kawada | 341/144 |
| 5,252,975 | 10/1993 | Yuasa et al. | 341/145 |
| 5,495,245 | 2/1996 | Ashe | 341/145 |
| 5,619,203 | 4/1997 | Gross | 341/144 |

OTHER PUBLICATIONS

Behzad Razavi et al., "A 12-b 5-MSample/s Two-Step CMOS A/D Converter", *IEEE Journal of Solid-State Circuits*, vol. 27, No. 12, pp. 1667–1678 (Dec. 1992).

Marcel J.M. Pelgrom, "A 10-b 50-MHz CMOS A/D Converter with 75-Ω Buffer", *IEEE Journal of Solid-State Circuits*, vol. 25, No. 6, pp. 1347–1352 (Dec. 1990).

Peter Holloway, "A Trimless 16b Digital Potentiometer", *ISSCC Digest of Technical Papers*, pp. 66–67 and 320–321 (Feb. 1984).

*Primary Examiner*—Jeffrey A. Gaffin
*Assistant Examiner*—Jason H. Vick
*Attorney, Agent, or Firm*—Thomas Schneck

[57] ABSTRACT

In a dual resistor string digital-to-analog converter, current biasing is used to isolate a first resistor string from a second resistor string. The first resistor string consist of multiple first resistors, and a first switch network responsive to the MSBs selectively couples the second resistor string in parallel to any one first resistor within the first resistor string. To prevent the second resistor string from drawing current from the first resistor string, a current source feeds a bias current into the second resistor string and a current drain draws the bias current from the second resistor string. The bias current is adjusted such that the voltage drop across the whole of the second resistor string is equal to the voltage drop across any one first resistor within the first resistor string. Use of a current source and current drain allows one to freely adjust the number of MSBs, LSBs and first and second resistor magnitudes to obtain optimum performance without concern for any adverse nonlinearity effects.

38 Claims, 8 Drawing Sheets

1

DIGITAL TO ANALOG CONVERTER WITH DUAL RESISTOR STRING

TECHNICAL FIELD

The invention relates to voltage scaling digital-to-analog converters. More specifically, it relates to integrated digital-to-analog converters which use two resistor strings to break-up an input data word into two separately decoded data segments.

BACKGROUND ART

It is desirable to construct a digital-to-analog converter, DAC, in standard, sub-micron, single-poly CMOS digital processes, but it is generally not practical to construct traditional charge redistribution analog circuits in such processes. A charge redistribution DAC structure would likely suffer from linearity problems due to poor quality poly-metal capacitors, or else require excessively high chip areas due to low specific capacitance values. Therefore, much interest has been placed on voltage scaling DACs, which are based on resistive networks and can have a resolution accuracy up to a mid-high range of 8 to 10 bits. Additionally, voltage scaling DACs are fully compatible with single-poly CMOS digital processes and do not require linear capacitors. Moreover, voltage scaling DACs have an inherent conversion monotonicity desirable in digital-to-analog converters.

With reference to FIG. 1, a basic voltage scaling digital-to-analog converter, DAC, 15 consists of one resistor string 11 of multiple resistors R1–R8 in series and a multiplexer 13 transmitting a selected resistor node n0–n7 to output Vout in response to a digital input D0–D2. The structure of DAC 15 requires a resistor count and switch count equal to $2^N$ where N is the bit resolution. DAC 15 has a three bit resolution and so uses $2^3$, or 8, resistors R1–R8 to divide a voltage difference across resistor string 11 into 8 equal voltages steps.

A first reference voltage +Vref is applied to R8 and a second reference voltage –Vref is applied to R1 such that the voltage difference, $\Delta V$, across resistor string 11 is +Vref less –Vref and the voltage drop across each resistor R1–R8 is $\Delta V/8$. Since resistors R1–R8 are connected in series, node n0 has a voltage of –Vref and each subsequent node n1–n7 has an incremental voltage step of $\Delta V/8$. Nodes n0–n7 are applied to respective MUX inputs i0–i7, and each MUX input i0–i7 is connected to a respective switch S0–S7 which, when selected, couples one of inputs i0–i7 to Vout. For example, if D0–D2 receive data "101", MUX 13 will decode this as a base-2 number 5 and close switch S5. This will couple a voltage of $-Vref + \Delta V(5/8)$ from node n5 to Vout. As input data D0–D2 is cycled through all eight of its possible combinations from "000" to "111" the voltage at respective nodes n0-n7 will be transferred to Vout. A similar structure is shown in U.S. Pat. No. 5,126,740.

The voltage scaling structure of DAC 15 is suitable only for low bit resolutions since the number of resistors and switches, and hence decoding complexity, grows exponentially with increasing bit resolution. As its resistor and switch count increases, so does its output impedance and parasitic capacitance, both of which degrade performance. Additionally, since all $2^N$ resistors require an N-bit matching accuracy, resistor dimensions must be increased with increasing bit resolution which further increases parasitic capacitance. To achieve a higher resolution, a different DAC structure is needed.

With reference to FIG. 2, an alternate prior art DAC 19 uses two resistor strings 21 and 23 to achieve a resolution of 8 bits. In the present example, coarse resistor string 21 consists of 16 coarse resistors, CR0–CR15, and fine resistor string 23 consists of 256 fine resistors, F1–F256, formed into a matrix. The terms "coarse" and "fine" refer to the voltage step, or resolution, across each resistor and not to their resistive value. Coarse resistor string 21 has fewer resistors than fine resistor string 23 and thus has a higher voltage drop across its individual resistors CR0–CR15. Unit 17 is a combination fine resistor string matrix and multiplexer, and can decode an 8-bit data input and couple the appropriate node within fine resistor string 23 to Vout by means of 256 switches, S0–S255, in a manner similar to FIG. 1.

Coarse resistor string 21 performs a coarse voltage conversation by dividing a voltage $\Delta V$ applied across it (+Vref less –Vref) into 16 coarse voltage increments of $\Delta V/16$ each. Fine resistor string 23 supplies a fine voltage conversion by first being divided into equal resistor segments Seg0–Seg15 and having each resistor segment Seg0–Seg15 connected in parallel to a respective coarse resistors CR0–CR15. In the present case, fine resistor string 23 is broken into 16 resistors segments Seg0–Seg15 with each resistor segment having 16 fine resistors. For example, Seg0 consists of F1–F16, Seg1 consists of F17–F32, etc. In this manner, each resistor segment Seg0–Seg15 subdivides the voltage drop across each coarse resistor CR0–CR15 into 16 smaller fine voltage units of $\Delta V/256$ each. To illustrate, if data inputs D0–D7 receive an input of "00100010", indicating a binary 34, then switch S34 in fine resistor string 23 will couple the node between F34 and F35 to Vout. Since F34 is the second fine resistor within Seg2, which is connected in parallel to CR2, Vout receives the voltage at the bottom of CR2, $\Delta V(2/16)$, plus two fine voltage steps of $\Delta V/256$ each for a total of $\Delta V(34/256)$.

Because of coarse resistor string 21, the dual string structure of DAC 19 requires a higher resistors count than the basic single string structure of DAC 15, but DAC 19 still achieves a lower output impedance, lower parasitic capacitance and overall better performance. Like DAC 15, coarse resistors CR0–CR15 require an N-bit matching accuracy where N is the bit resolution, but fine resistors F1–F256 require a matching accuracy determined only by the size of each resistor segment Seg0–Seg15. Since Seg0–Seg15 consists of 16 resistors each, fine resistors F1–F256 need only a 4-bit matching accuracy and can consequently have their dimensions reduced. Because of the reduced size of F1–F256, switches S0–S256 can likewise be reduced resulting in DAC 19 have smaller dimensions and a lower parasitic capacitance than a DAC of equivalent resolution. Additionally, since the equivalent resistance of a resistor segment Seg0–Seg15 in parallel with a coarse resistor CR0–CR15 is smaller than either the coarse resistor or resistor segment alone, the maximum output impedance of DAC 19 is also reduced. But it can be shown that if current consumption remains constant, the maximum output impedance of a single string DAC 15 and dual string DAC 19 remains practically of the same order of magnitude. Although DAC 19 offers higher performance than DAC 15, due mainly to its reduction in parasitic capacitance, DAC 19's parasitic capacitance is still relatively high since it still requires a large number of resistors and switches. Similar DAC structures are shown in U.S. Pat. Nos. 5,059,978 and 5,093,661, as well as in "A 10-b 50-MHz CMOS D/A Converter with 75-Ω Buffer", IEEE Journal of Solid State Circuits, vol. 25, no. 6, (December 1990).

With reference to FIG. 3, an alternate prior art dual string DAC 25 reduces the resistor count in the order of $-2*2^{N/2}$ as compared to the $2^N$ resistors required in a single resistor string DAC. Consequently, DAC switch count, parasitic capacitance and decoder complexity are also reduced. To obtain an N-bit resolution, the N-bit data is broken into two data segments, a most significant bit segment MSB and a least significant bit segment LSB, whose total bit count sums up to N. In the present example, an 8-bit data resolution is broken down into a 4 MSB segment applied to coarse resistor string 27 and a 4 LSB segment applied to a fine resistor string 29, which requires a lower level of matching accuracy. Each 4-bit segment is read separately, which further reduces decoding complexity.

Coarse resistor string 27 consists of 16 coarse resistors CR0–CR15 and divides the voltage across it, $\Delta V$, into 16 equal segments of $\Delta V/16$. Each node n0–n16 within coarse resistor string 27 is applied to a specialized first multiplexer MUX1. MUX1 decodes MSBs D4–D7, and closes a two-switch pair CS0–CS15 corresponding to the decoded input, as opposed to closing a single switch in a conventional multiplexer. Except for the extreme nodes n0 and n16 of coarse resistor string 27, each node n1–n15 is applied to two terminals of two adjacent switch pairs. By closing of the appropriate switch pair CS0–CS15, both nodes on either end of a selected coarse resistor CR0–CR15 are transferred to a pair of MUX1 outputs, VH and VL, with VH receiving the higher potential node and VL receiving the lower potential node. The voltages of VH and VL are applied across fine resistor string 29, which consists of 16 additional fine resistors FR0–FR15. MUX1 thus connects fine resistor string 29 in parallel to any one of coarse resistors CR0–CR15. The voltage drop across a selected coarse resistor CR0–CR15 is thereby ideally divided into 16 additional resolution increments of $\Delta V/256$ each by means of fine resistors string 29. A second multiplexer, MUX2, responds to LSBs D0–D3 and transfers a node within fine resistor string 29 to Vout in a manner similar to FIG. 1.

For example, if data inputs D0–D7 receive a binary 34, "00100010", MUX1 will decode the MSBs as being a binary number 2 and close switch-pair CS2. This will couple fine resistor string 29 in parallel with CR2. The higher potential node n3 of CR2 is applied to VH and the lower potential node n2 is applied to VL. MUX1 thereby ideally applies the voltage $\Delta V/16$ across CR2 to fine resistor string 29, while conveying an additional offset voltage of $\Delta V(2/16)$ from node n2 to VL. MUX2 decodes the LSBs as being a binary 2 and closes switch FS2 which taps the lower node of fine resistor FR2. Vout thereby receive a voltage of $\Delta V(2/16)+\Delta V(2/256)$ for a total of $\Delta V(34/256)$.

DAC 25 may reduce the overall resistor and switch count, but introduces two new nonlinearity problems. The first problem is an Integral Nonlinearity (INL) conversion error arising from the loading effect of fine resistor string 29 on coarse resistor string 27. Since coarse resistor string 27 provides not only the voltage drop across a selected coarse resistor CR0–CR15 to fine resistor string 29, but also provides a voltage offset to lead VL equal to the sum of the voltage drops across all coarse resistors below the selected coarse resistor, the voltage drop across each coarse resistor CR0–CR15 must be equal and constant. However, the parallel combination of fine resistor string 29 and any selected coarse resistor CR0–CR15 has an equivalent resistance different than that of a single coarse resistor alone. The change of the resistive value of a single coarse resistor CR0–CR15 changes the current in the entire coarse resistor string 27 and thereby changes the voltage drop across not only the selected coarse resistor, but also all other coarse resistors in string 27. Furthermore, the change in voltage drop across the selected coarse resistor is different than the change in voltage drop across all other coarse resistors. INL errors can be reduced by making the resistive value of fine resistors FR0–FR15 very much greater than the resistive values of coarse resistors CR0–CR15, but this reduces the conversion speed dramatically.

The second problem is a Differential Nonlinearity (DNL) conversion error arising from current flowing through analog switches in series with fine resistor string 29. When fine resistor string 29 draws current from coarse resistor string 27, DNL errors are introduced by the "ON"resistances of any selected switch-pair CS0–CS15 in the current path. DNL errors can be reduced by making the "ON" resistances of switch-pairs CS0–CS15 very much smaller than that of fine resistors FR0–FR15, but this requires big switches with high capacitances, which dramatically reduces conversion speed.

With reference to FIG. 4, a different approach toward reducing INL and DNL errors is to incorporate additional isolation circuitry into DAC 25. Similar structure DACs are shown in U.S. Pat. No. 5,252,975 and in "A Trimless 16-bit Digital Potentiometer", ISSCC Digest of Technical Papers, pp. 66–67 (February 1984). All elements having a similar function as in FIG. 3 are identified by similar reference characters and explained above. To prevent INL error, fine resistor string 29 is isolated from coarse resistor string 27 by means of two Op Amps 31 and 33. Op Amp 31 is connected as a voltage follower and transfers voltage VH from MUX1 to the upper node of FR15. Op Amp 33 is also connected as a voltage follower and transfers voltage VL from MUXi to the lower node of FR0. Since Op Amps 31 and 33 have a very high input impedance, they reduce the current through switch-pairs CS0-CS15 and thereby reduce DNL error. Op Amps 31 and 33 function as voltage sources supplying the voltages on either end of a selected coarse resistor CR0–CR15 to fine resistor string 29 while isolating it from coarse resistor string 27.

This version of DAC 25 only partially solves the issues of INL and DNL errors. First, Op Amps 31 and 33 place a premature upper limit on the frequency operation of DAC 25. At frequencies beyond the Op Amps' cut-off frequency, VH and VL are not properly transferred to fine resistor string 29. Thus, Op Amps 31 and 33 require a high gain band width, GBW, but this results in high current consumption which raises the DAC's power requirements considerably. Secondly, both Op Amps 31 and 33 have an inherent input offset voltage between their noninverting and inverting input terminals. This offset voltage must be kept below half of one LSB, which is not easily achievable at medium-resolution DACs and very difficult at high resolution. The DAC structure of FIG. 5 attempts to reduce these operating limitations by eliminating the need for isolating one resistor string from another.

With reference to FIG. 5, a different dual string DAC 35 structure has a typical fine resistor string 37, but a modular coarse resistor string 39. A first MUX1 41 decodes MSBs D4–D7 and activates a corresponding pair of double throw switches CS0'/CS0" to CS15'/CS15". Both nodes of each coarse resistor CR0–CR15 can be simultaneously selected and inserted in series with coarse resistor string 39 by a corresponding pair of double throw switches CS0'/CS0" to CS15'/CS15", or both nodes can be disconnected from coarse resistor string 39 by means of the same pair of double throw switches. MUX1 41 decodes MSB D4–D7 and disconnects the selected coarse resistor CR0–CR15 from coarse resistor string 39. The selected pair of double throw switches CS0'/CS0" to CS15'/CS15" then inserts in series fine resistor string 37 into coarse resistor string 39 in place of the disconnected coarse resistor. For example, if data inputs D0–D7 receive a binary 34, "00100010", the MSBs D4–D7 are decoded as a binary 2 causing coarse resistor CR2 to be disconnected from coarse resistor string 39 by means of double throw switch pair CS2'/CS2". Double throw switch CS2" then inserts the high voltage node VH of fine resistor string 37 into the coarse resistor string 39 and switch CS2' inserts the low voltage node VL of fine resistor string 37 into coarse resistor string 39. MUX2 then decodes the LSBs D0–D3 and closes fine switch FS2 causing node n2 of fine resistors string 37 to be transferred to Vout. Vout thereby ideally receives the voltage offset across CR0 and CR1, $\Delta V(2/16)$, plus the tap at the bottom of FR2, $\Delta V(2/256)$, for a total of $\Delta V(34/256)$.

DAC 35, however, is only a partial solution to INL and DNL errors. DAC 35 will not experience a bad INL error from a load effect on coarse resistor string 39 by fine resistor string 37 as long as the total resistance of fine resistor string 37 is very closely equal to the resistance of the coarse resistor CR0–CR15 it replaces. To ensure a close match of fine resistor string 37 with any one coarse resistor RC0–CR15 over process and temperature variations, the dimension of each coarse resistor and fine resistors string 37 must be greatly increased, but this increases parasitic capacitances and decreases performance.

Additionally, DAC 35 does not correct for DNL error, which is just as important and INL error. The more complicated switching and decoding scheme of MUX1 41 places a pair of analog switches in series with the paths inserting fine resistor string 37 in series with the coarse resistor string 39. These added switches CS0'/CS0" to CS15'/CS15" are a new and substantial source of DNL error. One way of reducing this error is to make the "ON" resistances of the switches much smaller than resistor CR0–CR15 and FR0–FR15, but this means increasing the resistor values even more or using much larger switches. Both of these solutions to DNL error further reduce conversion performance.

It is an object of the present invention to provide a high-bit resolution digital-to-analog converter with a reduced number of required resistors and switches.

It is another object of the present invention to provide a digital-to-analog converter whose frequency performance is not limited by any circuit technique used to compensate for nonlinearity errors.

It is another object of the present invention to provide a digital-to-analog converter having a nonlinearity error compensating circuit which improves overall conversion performance.

It is another object of the present invention to provide a two resistor string digital-to-analog converter which prevents one resistor string from loading the other.

It is another object of the present invention to provide a digital-to-analog converter which corrects for DNL and INL errors.

It is another object of the present invention to provide a digital-to-analog converter with additional degrees of design freedom which allows it to be optimize for speed and power consumption while simultaneously compensating for DNL and INL errors.

It is another object of the present invention to provide a digital-to-analog converter with reduced output impedance and reduced parasitic capacitance.

DISCLOSURE OF THE INVENTION

The above objects have been met in an N-bit digital-to-analog converter having a dual string structure. The N-bits are subdivided into c MSBs and f LSBs where f=N-c. A coarse resistor string of $2^c$ coarse resistors is coupled between a high and low reference voltage. A fine resistor string of $2^f$ fine resistors may be connected in parallel to any one coarse resistor by means of a switch network. A current source feeds a bias current into the fine resistor string and a current drain draws the bias current out of the fine resistor string. The bias current is adjusted such that the fine resistor string always has a voltage drop equal to the voltage drop across any one coarse resistor. When the fine resistor string is connected in parallel to a coarse resistor, the fine resistor string draws no current from the coarse resistor string since there is no voltage difference across the switch network coupling it to the selected coarse resistor and all required bias current is supplied by the current source and current drain. The digital-to-analog converter experiences no INL error from any loading effect and no DNL error from the switch network since the fine resistor string does not draw current from the coarse resistor string.

Since the current source and the current drain supply all the required bias current for the fine resistor, design parameters such as the resistive values of the coarse resistor and fine resistor as well as c and f can now be varied freely. The DAC of the present invention can therefore be optimized for speed versus power consumption by determining the optimum values of the design parameters and adjusting the bias current accordingly to prevent DNL and INL errors.

BEST MODE OF CARRYING OUT THE INVENTION

Figure 6:
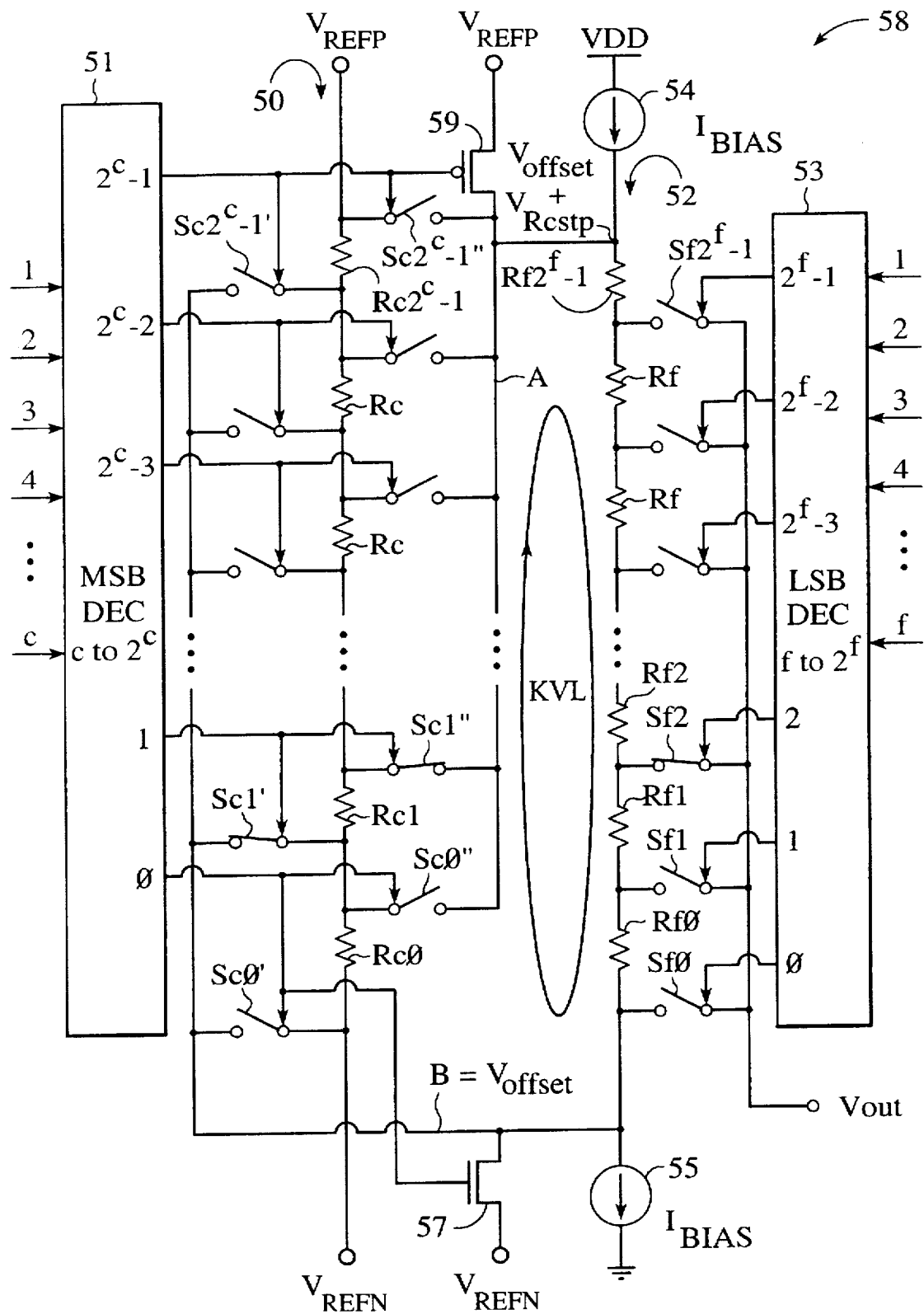
FIG. 6 is a block structure of a digital-to-analog converter in accord with the present invention.

With reference to FIG. 6, a digital-to-analog converter, DAC, 58 in accord with the present invention has a dual string resistive network 50 and 52 accessed by two decoders DEC-51 and DEC-53. A desired N-bit resolution DAC 58 is subdivided into two sub-DACs of lesser resolution c and f where c-bits offer a first digital-to-analog coarse sub-conversion and the remaining f-bits provide a second finer sub-conversion of the initial coarse sub-conversion. The N-bits are subdivided such that the c-bits define a predetermined number of most significant bits, MSBs, and the f-bits define the remaining, or least significant bits, LSBs.

$$f=N-c \qquad (1)$$

String 50 is a coarse resistor string having a size determined by the selected resolution of c-bits. Coarse resistor string 50 comprises $2^c$ coarse resistors of equal value Rc connected in series. Both upper and lower nodes on opposite sides of each coarse resistor $Rc_0$ to $Rc_{2^c-1}$ may be simultaneously accessed by means of a corresponding switch pair $Sc_0'/Sc_0''$ to $Sc_{2^c-1}'/Sc_{2^c-1}''$. DEC-51 decodes the MSBs of DAC 58 and is therefore a c-to-$2^c$ decoder receiving c-MSB inputs and placing an actuation signal on one of $2^c$ outputs as determined by the c-MSB inputs. Each output, numbered from 0 to $2^c$-1, controls a corresponding switch pair $Sc_0'/Sc_0''$ to $Sc_{2^c-1}'/Sc_{2^c-1}''$ and thereby accesses both upper and lower nodes of any one coarse resistor $Rc_0$ to $Rc_{2^c-1}$. The upper node of a selected coarse resistor is transferred to lead A and the lower node is transferred to lead B. Assuming that the current Ic through coarse resistor string 50 is constant and unperturbed in any coarse resistor $Rc_0$ to $Rc_{2^c-1}$, then each coarse resistor $Rc_0$ to $Rc_{2^c-1}$ has an equal voltage drop of one coarse voltage step, $V_{Rcstp}$=IcRc, with the lower node, that is the node closer to $V_{REFN}$, having a voltage offset, $V_{offset}$, equal to $V_{Rcstp}$ times the number of coarse resistors below it plus $V_{REFN}$, and the upper node having a voltage equal to one $V_{Rcstp}$ above the lower node. Thus the voltage difference between lead A and lead B is always $V_{Rcstp}$, and lead B carries a variable voltage offset $V_{offset}$ dependent on the selected coarse resistor $Rc_0$ to $Rc_{2^c-1}$. Leads A and B are connected directly to resistors string 52.

String 52 is a fine resistors string for subdividing $V_{Rcstp}$, the voltage across leads A and B, into multiple finer voltage subdivisions across a second set of resistors of equal value Rf. Fine resistor string 52 comprises $2^f$ fine resistors Rf connected in series which divides $V_{Rcstp}$ into $2^f$ finer voltage subdivisions. Each incremental voltage subdivision may be tapped at any node within fine resistors $Rf_0$ to $Rf_{2^f-1}$ by means of a corresponding switch $Sf_0$ to $Sf_{2^f-1}$. DEC-53 decodes the f-LSBs of DAC 58 and is therefore an f-to-$2^f$ decoder receiving f-LSB inputs and placing an actuation signal on one of $2^f$ outputs as determined by the f-LSB inputs. Each DEC-53 output, numbered from 0 to $2^f$-1, controls a corresponding switch $Sf_0$ to $Sf_{2^f-1}$ and thereby accesses any node within fine resistor string 52 and transfers the accessed node to Vout. Furthermore, since leads A and B may access any coarse resistor $Rc_0$ to $Rc_{2^c-1}$ within coarse string 50 and leads A and B are applied directly to fine string 52, string 52 is effectively a floating resistor string which may be directly connected in parallel to any one coarse resistors $Rc_0$ to $Rc_{2^c-1}$. Additionally, unlike coarse string 50, which is coupled between two internally generated reference voltages $V_{REFP}$ and $V_{REFN}$, floating string 52 is coupled between two power rails VDD and ground having a larger voltage difference than $V_{REFN}$ and $V_{REFP}$. Typically, the two voltage references and two power rails are defined by the following relationship:

$$VSS \leq V_{REFN} \leq V_{REFP} \leq VDD \qquad (2)$$

Ordinarily, applying a floating fine string, such as string 52, directly in parallel to any coarse resistor within a coarse resistor string, such as string 50, would result in INL error, and the drawing of current through series connected switches, such as $Sc_0'/Sc_{2^c-1}''$, would result in DNL error. DAC 58 prevents INL and DNL errors by using two current generators 54 and 55 to apply a current bias to one of the resistor strings 50 and 54. A similar current biasing technique is uses in the construction of a voltage comparator in "A 12-b Two-Step CMOS A/D Converter", IEEE Journal of Solid State Circuits, vol. 27, no. 12 (December 1992).

Two current generators 54 and 55 maintain a constant voltage drop, $V_{f\text{-}strg}$, across floating string 52. 5 By proper adjustments of the current bias, floating string 52 can be prevented from drawing current from coarse string 50 and thus avoid DNL error. A first current generator, current source 54, is inserted between VDD and floating string 52, and feeds bias current $I_{BIAS}$ into floating string 52. A second current generator, current drain 55, is applied between floating string 52 and ground, and draws the same current $I_{BIAS}$ out of floating string 52. Since all $2^f$ fine resistors $Rf_0$ to $Rf_{2^f-1}$ are of equal value Rf, the voltage across fine resistors $Rf_0$ to $Rf_{2^f-1}$ is defined as $V_{f\text{-}strg}=I_{BIAS}2^fRf$. As long as no INL error occurs, the voltage difference between leads A and B will be ideally equal to one coarse voltage step $V_{Rcstp}$. $I_{BIAS}$ may be chosen such that $V_{f\text{-}strg}$, the voltage difference between leads A and B, is exactly equal one coarse resistor voltage step, $V_{Rcstp}$ and thereby prevents INL error. Since $I_{BIAS}$, the current needed to assure that $V_{fstrg}$= $V_{Rcstp}$ is entirely supplied by current generators 54 and 55, the current Ic flowing through any selected coarse resistor $Rc_0$ to $Rc_{2^c-1}$, as determined by DEC 51, remains unperturbed and is ideally identical to the current Ic floating through the remaining coarse resistors, where $$Ic = \frac{(V_{REFP} - V_{REFN})}{2^c Rc} \qquad (3)$$

Figure 1:
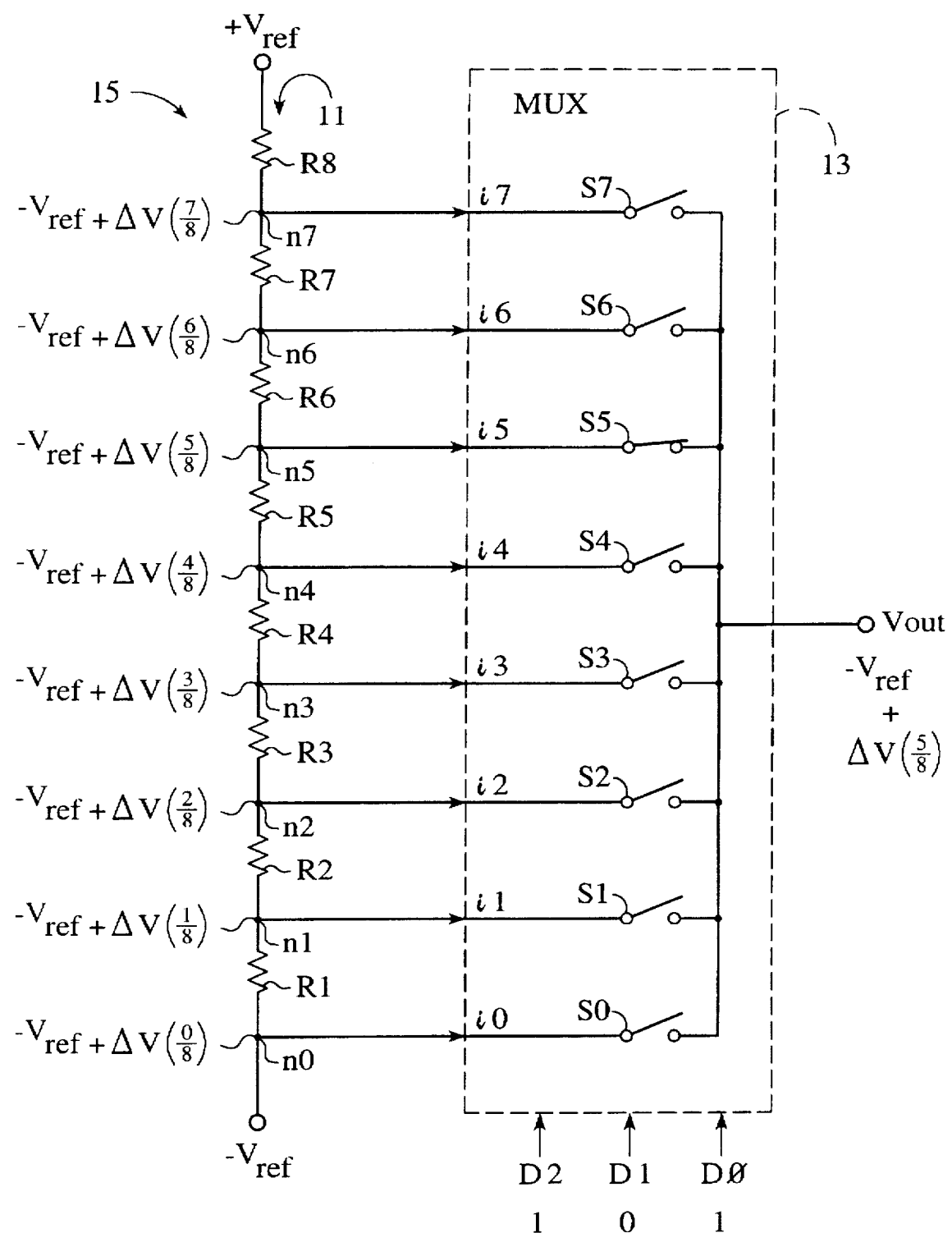
FIG. 1 is a prior art single resistor string voltage scaling digital-to-analog converter.
Figure 2:
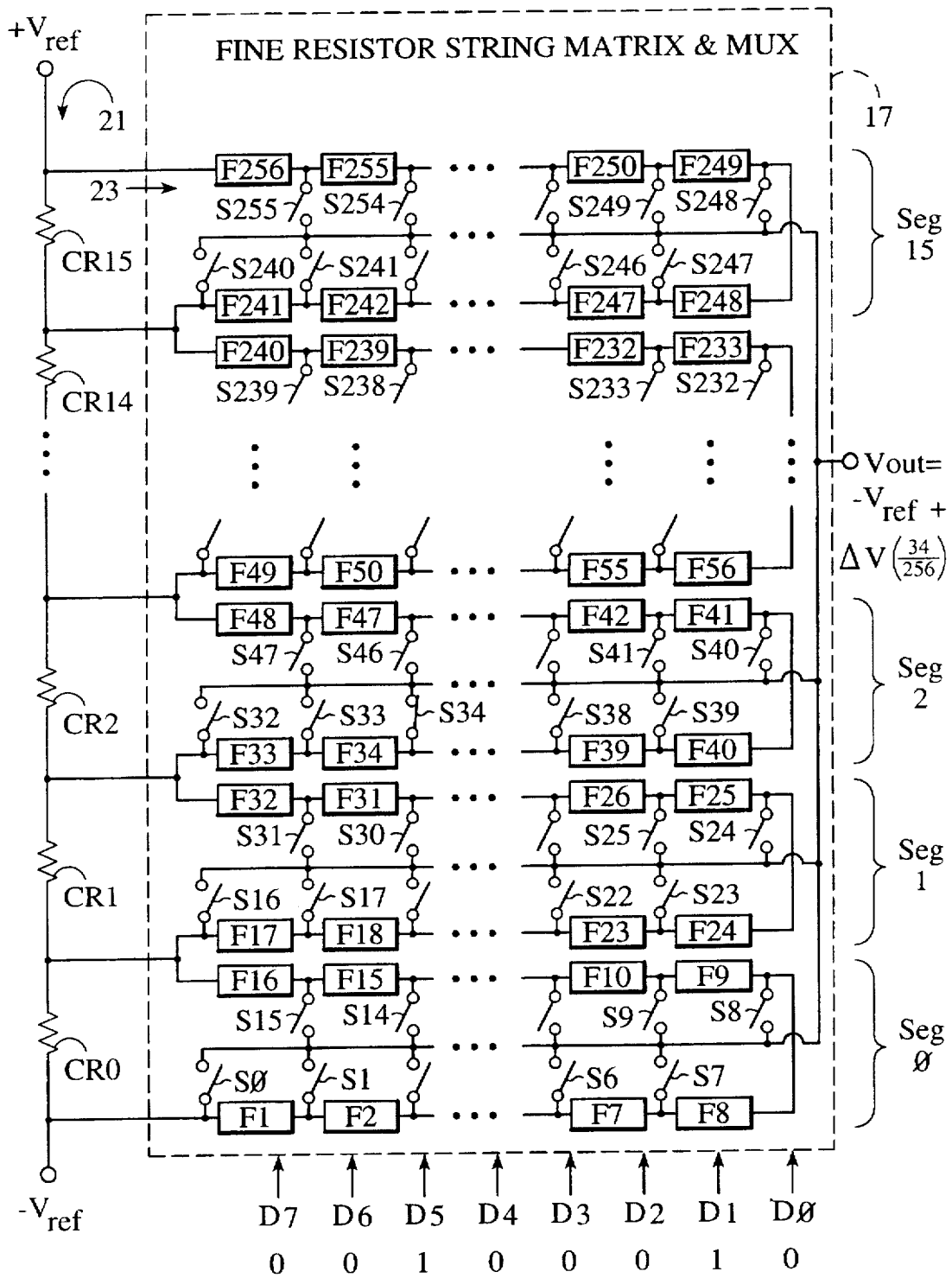
FIG. 2 is a prior art dual resistor string voltage scaling digital-to-analog converter.
Figure 3:
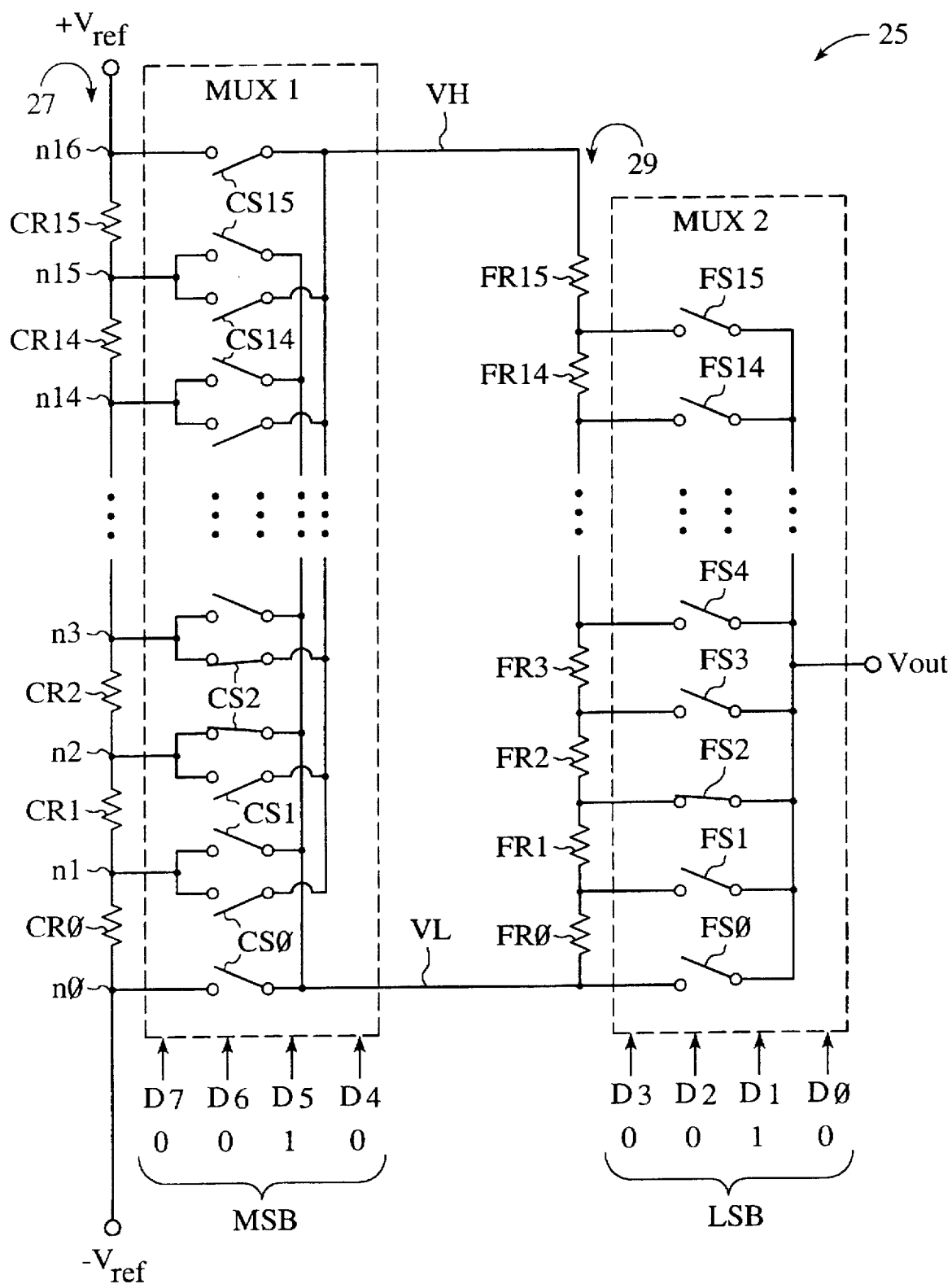
FIG. 3 is an prior art dual resistor string voltage scaling digital-to-analog converter using a floating fine resistor string.
Figure 4:
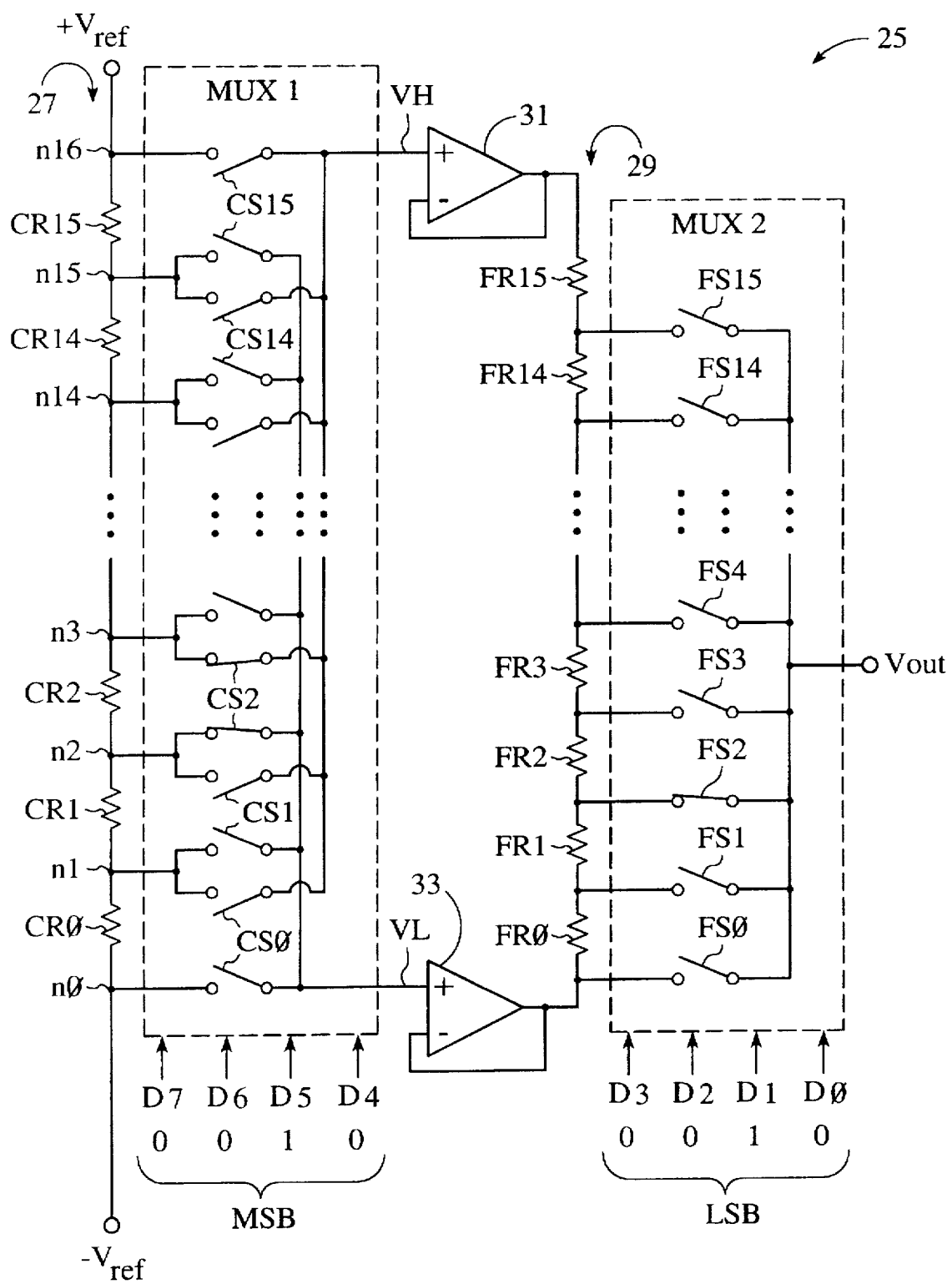
FIG. 4 is a prior art dual resistor string voltage scaling digital-to-analog converter as in FIG. 3 with additional isolation circuitry.
Figure 5:
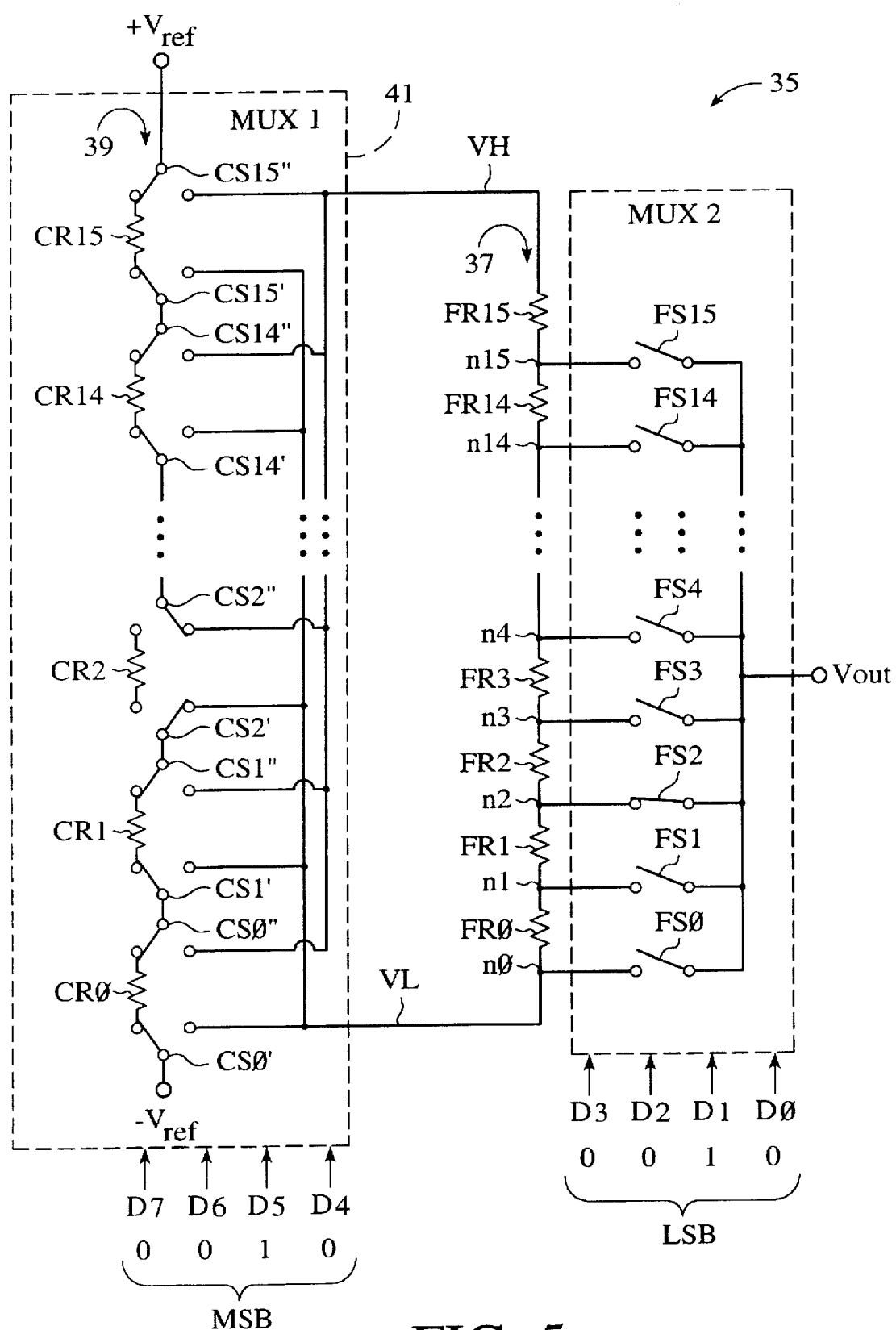
FIG. 5 is an alternate prior art dual resistor string voltage scaling digital-to-analog converter using a floating fine resistor string.

Between the parallel connection of any coarse resistor $Rc_0$ to $Rc_{2^c-1}$ and floating resistors string 52, there is always a pair of corresponding turned-on analog switches $Sc_0'/Sc_0''$ through $Sc_{2^c-1}'/sc_{2^c-1}''$. These switch pairs would normally introduce DNL error which would place limits on the relative sizes and dimensions of Rf and Rc, as discussed above, but since $I_{BIAS}$ is adjusted such that there is no voltage drop across the activated switch pair, no current flows through any of the switch pairs and they introduce no DNL error into DAC 58. Thus, current generators 54 and 55 prevent any conversion nonlinearity from occurring, independent of the resistive values of Rc and Rf or the number of c-bits and f-bits. Furthermore, since $I_{BIAS}$ is a constant current, it is not subject to the frequency limitations of the dual Op Amp voltage follower isolating technique of FIG. 3. This frees up several previously limiting design constraints and allows DAC 58 to be optimized for speed versus power consumption for any given resistive network.

It has been found that due to the physical structure of all typical current generators, such as current source 54 and current drain 55, current generators 54 and 55 may not function properly under two operating conditions, more fully explained below. These two operating conditions are when the highest ranking output $2^c$-1 of MSB DEC-51 is selected or when the lowest ranking output 0 of MSB DEC-51 is selected. Two additional switch transistors 59 and 57 rectify these conditions. When the highest ranking output $2^c$-1 of DEC-51 is activated, p-channel transistors 59 couples floating string 52 to $V_{REFP}$. This places floating resistors string 52 directly in parallel with coarse resistor $R_{c2^c-1}$ without drawing current from coarse resistor string 50 in spite of current source 54 not functioning properly. When the lowest ranking output 0 of DEC-51 is activated, n-channel transistors 57 couples floating string 52 to $V_{REFN}$. This places floating resistors string 52 directly in parallel with coarse resistor $Rc_0$ without drawing current from coarse resistor string 50 in spite of current drain 55 not functioning properly. With the aid of compensating switch transistors 59 and 57, the bias current $I_{BIAS}$ necessary for isolating floating string 52 and preventing DNL and INL errors may be calculated without any concern for the two above described operating deficiencies of current generators 54 and 55.

A loop following Kirchhoff's Voltage Law, KVL, around the parallel connection of floating string 52 and any one selected coarse resistor $Rc_0$ to $Rc_{2^c-1}$, along with the appropriate selection of design parameters c, f, Rc, Rf and $I_{BIAS}$, will assure that $V_{Rcstp}=V_{f-strg}$, or $$I_{BIAS}(2^fRf)=ICRC \quad (4)$$

In the example of FIG. 6, coarse resistor $Rc_1$ is selected by closing switch pair $Sc_1'/Sc_1''$. A KVL loop would follow the path from lead A to the upper node of $Rf_{2^f-1}$, through fine resistor string 52, out the lower node of $Rf_0$ to lead B, through switch $Sc_1'$ to the lower node of $Rc_1$, out the upper node of $Rc_1$ through switch $Sc_1''$ and back to lead B. Equation 4 gives a design degree of freedom since fine resistor string 52 may now consist of any number of f fine resistors having any desired resistive value Rf, irrespective of the value of coarse resistors Rc, and eqn. 4 will provide the corresponding bias current $I_{BIAS}$ for preventing INL and DNL errors.

In practice, the addition of current generators 54 and 55 allow the optimization of design parameters to achieve the best circuit performance. That is, the speed versus power consumption figure of a digital-to-analog converter in accord with the present invention may be exploited by means of the new design freedoms to achieve the correct $I_{BIAS}$ required for preventing DNL and INL errors for any given value of Rf, Rc, f and c. Alternatively, for any given current consumption limitations, i.e. power limitations, one can select the best set of Rc, Rf, c and f design parameters to achieve maximum operation speed.

For example, for a given maximum current consumption requirement, The speed versus current consumption figure of DAC 58 may be maximized by minimizing the equivalent resistance and parametric capacitance of its resistive network. One can now determine the ideal subdivision ratio of c-bits and f-bits as well as the smallest values of Rc and Rf with disregard to the limiting physical constraints relating coarse and fine resistors discussed above in regards to the prior art. This also reduces the switch dimensions which further reduce parasitic capacitance and minimizes silicon area.

For the sake of simplicity in deriving a set of relational formulas for the design parameters, assume that the fine resistance Rf is a power of 2 of the coarse resistance Rc.

$$Rf = \frac{Rc}{2^x} \text{ where } x = \ldots -2, -1, 0, 1, 2, \ldots \quad (5)$$

This Rf to Rc relationship facilitates the computational simulation of DAC 58, but is not critical the invention. Combining eqns. 4 and 5, the current in floating resistors string 52 $I_{BIAS}$, may be expressed as a function of the current in coarse resistors string 50 Ic.

$$I_{BIAS} = Ic \frac{Rc}{2^fRf} = Ic \frac{Rc}{2^f\left(\frac{Rc}{2^x}\right)} = 2^{x-f}Ic \quad (6)$$

The resulting total current for the complete resistive network is therefore:

$$I_{ntwk} = Ic + I_{BIAS} = Ic(1+2^{x-f}) = \left(\frac{V_{REFP}-V_{REFN}}{2^cRc}\right)(1+2^{x-f}) \quad (7)$$

Eqn. 7 may be rearrange to express the coarse resistor value Rc as a function of the remaining terms.

$$Rc = \frac{V_{REFP}-V_{REFN}}{2^cI_{ntwk}}(1+2^{x-f}) \quad (7a)$$

For any given set of design constraints N, $V_{REFP}-V_{REFN}$ and resistive network current $I_{ntwk}$, two degrees of freedom x and c are available to carry out the speed versus power consumption performance optimization. For any possible combination of x and c, eqns. 7a and 5 provide the values of Rc and Rf, and eqn. 1 provides the value of f.

Since we are interested in optimizing the dynamic performance of the data converter, it is advantages to relate the above derived design parameters to the maximum equivalent output resistance, $R_{out,max}$. In the present structure of DAC 58, the output resistance reaches its maximum when the midpoints of the coarse and fine resistors strings 50 and 54 are selected. Neglecting the "ON" resistances of all analog switches, $R_{out,max}$ is approximately given by:

$$R_{out,max} \approx \frac{2^cRc}{4} + \frac{2^fRf}{4} = \left(\frac{2^c}{4} + \frac{2^{N-c-x}}{2}\right)Rc \quad (8)$$

When the load capacitance $C_L$ and the output parasitic capacitance $C_P$ of DAC 58 are considered, $R_{out,max}$ and $C_L+C_P$ constitute the worst-case time constant $\tau_d$ delay for the circuit. The worst case time constant delay $\tau_d$ for an output signal to settle to the asymptotic output voltage within half a least significant bit is $$\tau_d = R_{out,max}(C_L+C_P)N\ln(2) \quad (9)$$

As an example of the optimizing of DAC 58, Tables 1A and 1B show two sets of calculations for a digital-to-analog converter having the following typical design constraints:

Total bit resolution: N=8-bits

Total current consumption: $I_{ntwk}$=100 μA

Net reference voltage: $(V_{REFP}-V_{REFN})$=2.5 V

Load capacitance: $C_L$=4pF

From Table 1A, it can be seen that for the case where c=f=4, the configuration with x=2, i.e. Rf=Rc/4, offers the optimum performance with a worst-case delay of 216 ns and a total of 100 μA current consumption. From Table 1B, optimum performance for the case where c=5 and f=3 is obtained with the configurations having x=0 or x=1, i.e. Rf=Rc or Rf=Rc/2, with both offering a worst-case delay of 195 ns.

TABLE 1A

| For c = 4 and f = 4: | | | | | |
|---|---|---|---|---|---|
| Rc (KΩ) Eqn. 7a | Ic (μA) Eqn. 3 | Rf (KΩ) Eqn. 5 | $I_{BIAS}$ (μA) Eqn. 6 | $R_{out,max}$ (KΩ) Eqn. 8 | τd (ns) Eqn. 9 |
| x = -1 | 1.61 | 97 | 3.22 | 3 | 19.32 | 428 |
| x = 0 | 1.66 | 94.1 | 1.66 | 5.88 | 13.28 | 294 |
| x = 1 | 1.76 | 88.8 | 0.88 | 11.1 | 10.55 | 234 |
| x = 2 | 1.95 | 80 | 0.488 | 20 | 9.76 | 216 |
| x = 3 | 2.34 | 66.6 | 0.293 | 33.3 | 10.55 | 243 |
| x = 4 | 3.12 | 50 | 0.195 | 50 | 13.28 | 294 |

TABLE 1B

For c = 5 and f = 3:

| | Rc (KΩ) Eqn. 7a | Ic (µA) Eqn. 3 | Rf (KΩ) Eqn. 5 | $I_{BIAS}$ (µA) Eqn. 6 | $R_{out,max}$ (KΩ) Eqn. 8 | τd (ns) Eqn. 9 |
|---|---|---|---|---|---|---|
| x = −2 | 0.805 | 96.97 | 3.22 | 3.03 | 12.89 | 286 |
| x = −1 | 0.83 | 94.13 | 1.66 | 5.88 | 9.96 | 221 |
| x = 0 | 0.879 | 88.88 | 0.879 | 11.11 | 8.79 | 195 |
| x = 1 | 0.977 | 80 | 0.488 | 20 | 8.79 | 195 |
| x = 2 | 1.172 | 66.66 | 0.293 | 33.33 | 9.96 | 221 |
| x = 3 | 1.562 | 50 | 0.195 | 50 | 12.89 | 286 |

Figure 7:
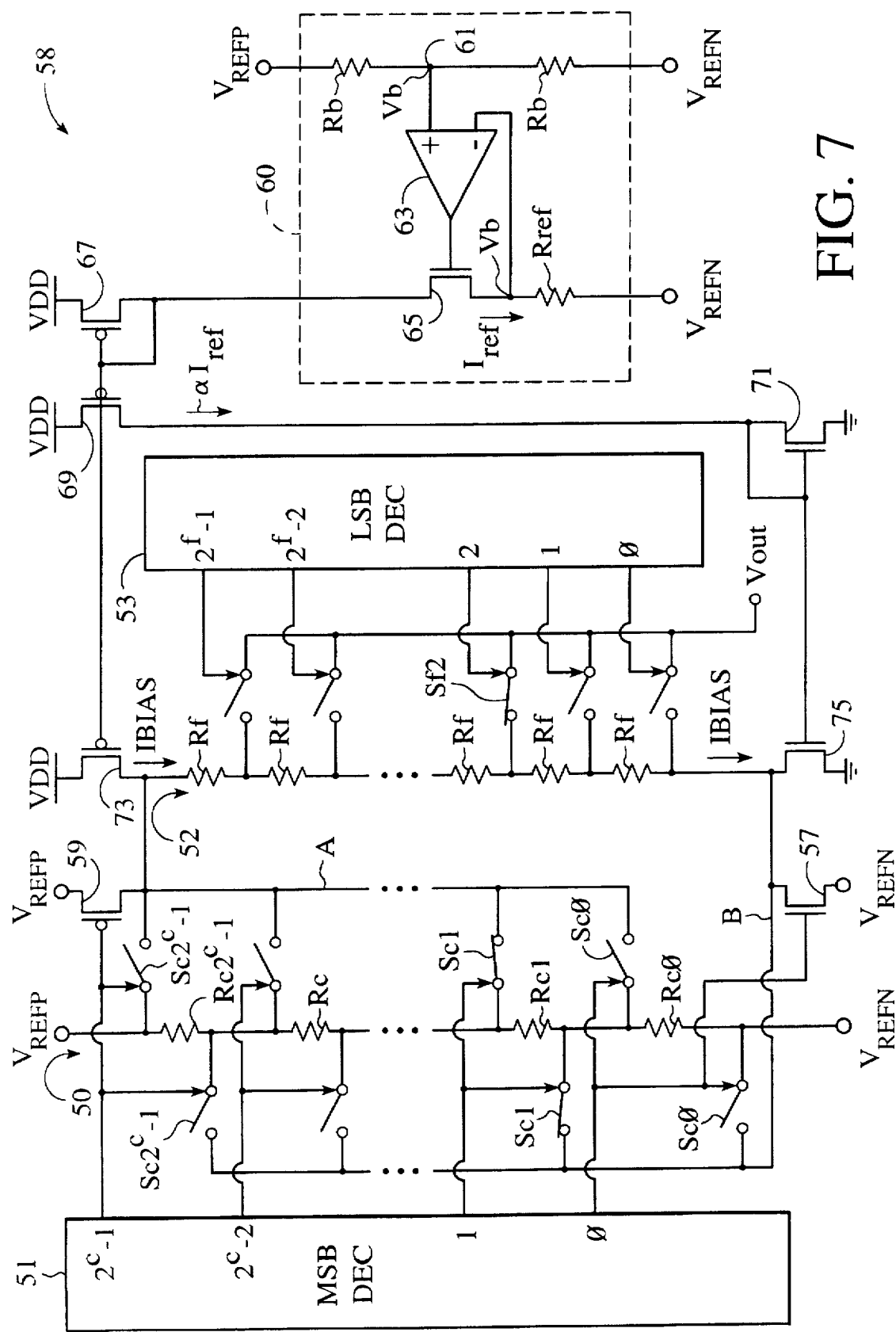
FIG. 7 is a best mode implementation of the digital-to-analog converter of FIG. 6.

A practical implementation of DAC 58 including the implementation of current generators 54 and 55 is shown in FIG. 7. With reference to FIG. 7, all elements having a similar function as in FIG. 6 are identified by similar reference characters and are explained above. A transconductance amplifier, or voltage-to-current converter, 60 in conjunction with a series of current mirrors 67–75 provide floating resistor string 52 with its required bias current $I_{BIAS}$. Voltage-to-current converter 60 consists of one Op amp 63 receiving a constant voltage Vb at its noninverting input terminal. To obtain a reasonable input common-mode voltage at the noninverting input of the Op-Amp 63, Vb is made equal to half of ($V_{REFP}-V_{REFN}$) by means of a simple resistive divider Rb-Rb. This voltage reference Vb of ($V_{REFP}-V_{REFN}$)/2 is also available at the center tap of coarse resistor string 50, but if the noninverting input of the Op-Amp 63 were tapped off of the resistive network of DAC 58, the system could be prone to instabilities. Vb is transferred from the inverting input terminal of Op Amp 63 to the source electrode of transistor 65 and one node of a reference resistor Rref. The closed loop feedback system of voltage-to-current converter 60 is completed by coupling the output of Op Amp 63 to the control gate of transistor 65.

The value of reference resistor Rref determines the amount of reference current Iref applied to current mirrors 67–75, which ultimately provides floating resistor string 52 with bias current $I_{BIAS}$. Since $I_{BIAS}$ is related to the current through coarse resistor string 50 Ic, by eqn. 4, Iref is likewise related to Ic. It can therefore be shown that reference resistor Rref is a multiple value of Rc, and if one assumes that Iref is exactly equal to $I_{BIAS}$, Rref can be defined as $$\text{Rref}=(\text{Rc})(2^{N-f-1})=(\text{Rf})(2^{N-1}) \quad (10)$$

Since the resistive value Rc of coarse resistors $Rc_0$ to $Rc_{2^c-1}$ is subject to variations due to process spreads and temperature excursions, current Ic may also vary. To ensure that equation 4 always remains satisfied, Rref, Rc and Rf should be matched in the layout and thereby allow $I_{BIAS}$ to track variations in Ic. In this way, DAC 58 is stabilized against process spread and temperature variations.

Current mirror 67/69, having a predetermined gain factor α, apply a measure of reference current Iref to transistor 71. Current mirror 67/69 is also extended to control current source transistor 73 which generates a current $I_{BIAS}$ proportional to αIref. Transistor 71 is connected as a current mirror to current drain transistor 75 causing it to generates the same current $I_{BIAS}$ in response to αIref. The current mirror gain factor α is used to lower power dissipation by making $I_{BIAS}$ a scaled version of Iref. In the present example, however, it is assumed that the current mirrors have a gain factor of unity and Iref is exactly equal to $I_{BIAS}$.

To ensure the best linearity performance of DAC 58, current source transistor 73 and current drain transistor 75 must be kept in their saturation region when any of coarse resistors $Rc_0$ to $Rc_{2^c-1}$ is selected. In applications where $V_{REFP}$ is close or equal to VDD and/or $V_{REFN}$ is close or equal to VSS, it can be difficult to assure that transistors 73 and 75 remain within saturation when the upper-most or lower-most output, respectively, of DEC-51 is selected. Switch transistors 59 and 57 prevent any nonlinearities resulting from transistors 73 or 75 not being saturated. Switch transistor 59 is controlled by the upper-most output $2^{c10^{71}}-1$ of DEC-51, and switch transistor 75 is controlled by the lower-most output 0 of DEC-51. When coarse resistor $Rc_{2^c-1}$ is selected, switch transistor 59 activates and offers a low impedance path through which lead A, the upper-most node of floating resistor string 52, is coupled to $V_{REFP}$. When switch transistor 59 is active, current source transistor 73 is inactive. When coarse resistor $Rc_0$ is selected, switch transistor 57 activates and offers a low impedance path through which, lead B, the lower-most node of floating resistor string 52, is coupled to $V_{REFN}$. When switch transistor 57 is active, current drain transistor 73 is inactive.

From FIG. 7, it can be seen that the total current consumption of DAC 58 is $$I_{tot}=IC+mI_{BIAS}+I_{OTA} \quad (11)$$

where the last term, $I_{OTA}$ includes the current consumption of the transconductance amplifier, OTA, 60 and resistive divider Rb-Rb. The multiplication factor m depends on the design choices, such as current mirror gain factor α, when sizing the components of the bias current generators. In the present example, α=1, Iref=$I_{BIAS}$ and m therefore equals 3. To decrease current consumption, all current contributions should be minimized. Current consumption due to the resistive network is minimized by careful selection of design parameters when implementing the above described speed versus current consumption optimization. When selecting design parameters, the multiplication factor m in eqn. 11 should be taken into account.

The function of transconductance amplifier 60 is to apply ($V_{REFP}+V_{REFN}$)/2 across Rref in order to generate $I_{BIAS}$, or its multiple. Op Amp 63 therefore does not have high frequency requirements, and OTA 60 only requires a high DC gain, a low offset voltage, good phase margin and poor bandwidth. All these specification can be accomplished using a very low power two-stage transconductance amplifier.

Figure 8:
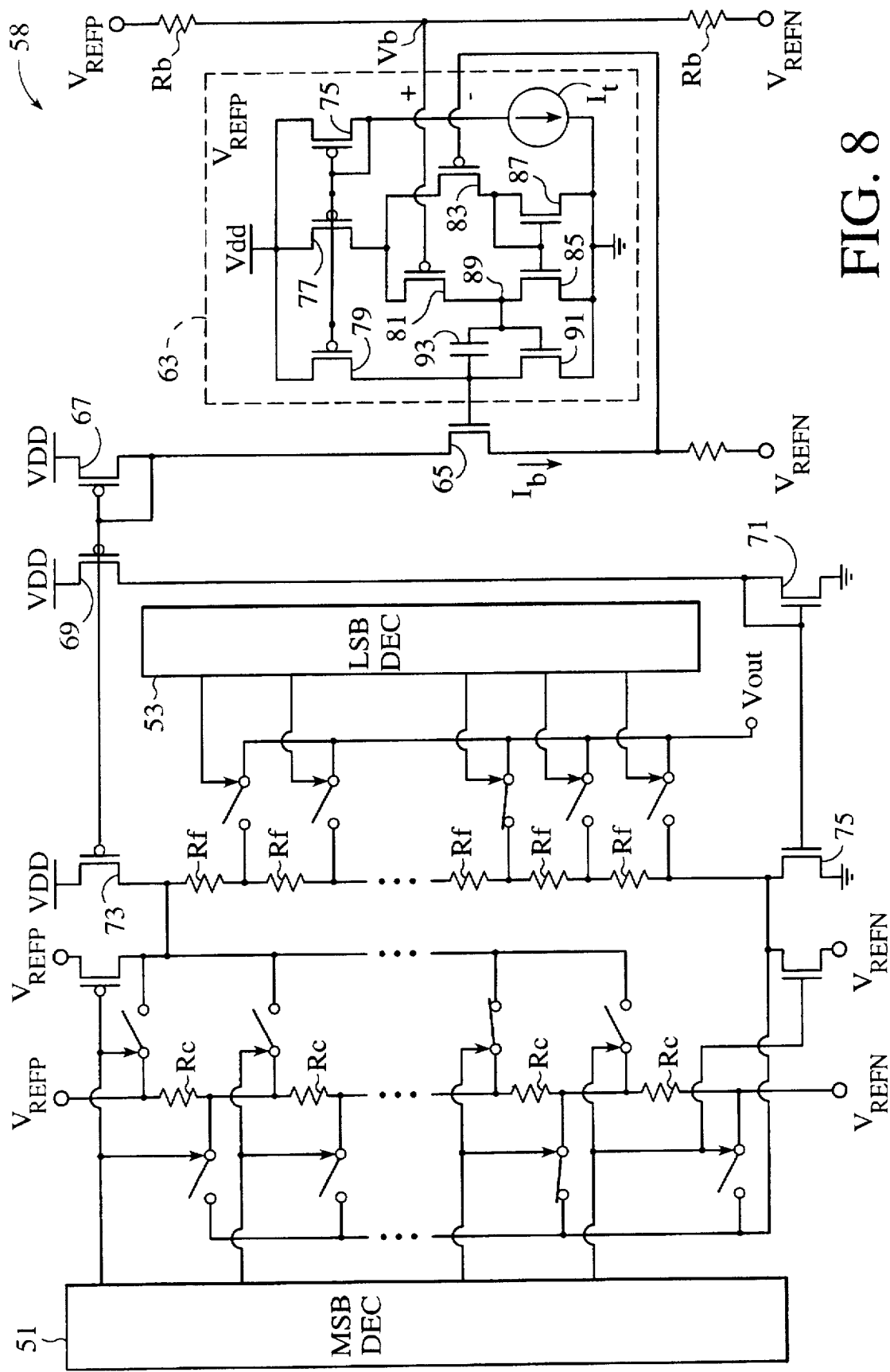
FIG. 8 is a transistor level implementation of the digital-to-analog converter in accord with the present invention.

With reference to FIG. 8, a transistor level implementation of Op Amp 63 is shown. A current source $I_r$ provides a reference current to the first stage by means of current mirror 75/77 and to the second stage by means of current mirror 75/79. A high DC gain can be obtained by using a low bias current $I_r$ and long channel MOS transistors. In the first stage, current source transistor 77 feeds into differential input transistors 81 and 83 which are coupled to current mirror 87/85. Low offset is achieved by using large area devices in the input pair and the active loads of the input stage. The output 89 of the first stage feeds into the second stage at the control gate of transistor 91 and at one node of a compensating capacitor 93. Transistor 91 receives current at its drain from source transistor 79, and has its source connected to ground. Compensating capacitor 93 has its other node connected to the output of Op Amp 63 at the drain of transistor 91. A good phase margin is achieved by using the Miller compensation technique by means of capacitor 93. In conventional digital technology, the compensating capacitor 93 is easily implemented using the gate oxide capacitance of an MOS transistor.

We claim:

1. A digital-to-analog converter comprising:
   a first resistor string having a plurality of first resistors;
   a second resistor string having a plurality of second resistors;
   a switching means for coupling said second resistor string in parallel to one of said first resistors;
   a current source coupled to supply a first current into said second resistor string; and
   a current drain coupled to draw a second current from said second resistor string.

2. The digital-to-analog converter of claim 1 wherein said switching means is effective for selectively coupling said second resistor string to any one of said first resistors.

3. The digital-to-analog converter of claim 1 wherein said first current is substantially similar to said second current.

4. The digital-to-analog converter of claim 1 wherein said first current traverses the entirety of said second resistor string.

5. The digital-to-analog converter of claim 4 wherein each of said plurality of first resistors has substantially the same voltage step across it, said first current generating a voltage drop across said second resistors string substantially similar to one of said voltage steps.

6. The digital-to-analog converter of claim 4 wherein said first current generates a voltage across said second resistor string sufficient for establishing a substantially zero voltage drop across said switching means.

7. The digital-to-analog converter of claim 1 wherein said switching means includes a plurality of switch pairs, each of said switch pairs being effective for selectively coupling one of said first resistors in parallel to said second resistor string, said first resistor string further being coupled between a first high reference voltage and a first low reference voltage.

8. The digital-to-analog converter of claim 7 further including a second switching means for coupling the uppermost node of said second resistor string to said first high reference voltage in response to said second resistor string being connected in parallel to the first resistor located closest to said first high reference voltage.

9. The digital-to-analog converter of claim 8 wherein said current source is coupled between a second high reference voltage and said second resistor string, said second high reference voltage being higher than said first high reference voltage.

10. The digital-to-analog converter of claim 9 wherein said current source deactivates in response to the actuation of said second switching means.

11. The digital-to-analog converter of claim 7 further including a second switching means for coupling the lowermost node of said second resistor string to said first low reference voltage in response to said second resistor string being connected in parallel to the first resistor located closest to said first low reference voltage.

12. The digital-to-analog converter of claim 11 wherein said current drain is coupled between a second low reference voltage and said second resistor string, said second low reference voltage being lower than said first low reference voltage.

13. The digital-to-analog converter of claim 12 wherein said current drain deactivates in response to the actuation of said second switching means.

14. The digital-to-analog converter of claim 7 further comprising a second switching means for selectively coupling any node intermediate said plurality of second resistors to an output lead,
   said first current further traversing the entirety of said second resistor string and being substantially similar to said second current,
   said digital-to-analog converter further having an N-bit resolution subdivided into c-MSBs and f-LSBs where f=N−c, said first resistor string having $2^c$ first resistors of substantially the same magnitude and said second resistor string having $2^f$ second resistors, each of second resistors having a magnitude substantially similar to the magnitude of a first resistor divided by 2 to a predetermined power x, each of said first resistors having a magnitude directly proportional to the difference of said first high reference voltage and first low voltage reference and inversely proportional to the sum of said first current and the current, Ic, in said first resistor string.

15. The digital-to-analog converter of claim 14 wherein the magnitude of each of said first resistors is substantially similar to the difference of said first high voltage reference and said first low voltage reference multiplied by the quantity of $(1+2^{x+c-N})$ and divided by the product of $2^c$ and the sum of said first current and Ic.

16. The digital-to-analog converter of claim 14 further having a maximum output impedance substantially similar to the magnitude of a first resistor multiplied by the quantity of $(2^c/4+2^{N-c-x}/2)$.

17. The digital-to-analog converter of claim 14 further having a capacitive load $C_L$ and parasitic capacitance $C_P$, where the worst-case time constant delay is substantially similar to the magnitude of a first resistor multiplied by the quantity of $(2^c/4+2^{N-c-x}/2)(C_L+C_P)N\ln(2)$.

18. A digital-to-analog converter comprising:
   first and second high reference voltage sources and first and second low reference voltage sources:
   a first resistor string coupled between said first high reference voltage source and said first low reference voltage source, said first resistor string having a plurality of first resistors;
   a second resistor string having a plurality of second resistors;
   a first switching means having a plurality of switch pairs with each switch pair corresponding to one of said plurality of first resistors, said first switching means being effective for selectively coupling said second resistor string in parallel to any one of said plurality of first resistors by means of a corresponding switch pair;
   a current source coupled between said second high reference voltage source and the upper-most node of said second resistor string, said current source being effective for supplying a first current into said second resistor string; and
   a current drain coupled between said second low voltage source and the lower-most node of said second resistor string, said current drain being effective for drawing a second current from said second resistor string.

19. The digital-to-analog converter of claim 18 further comprising a second switching means, said second switching means being effective for coupling the upper-most node of said second resistor string to said first high reference voltage source in response to said second resistor string being connected in parallel to the first resistor located closest to said first high reference voltage source.

20. The digital-to-analog converter of claim 19 wherein said current source deactivates in response to the actuation of said second switching means.

21. The digital-to-analog converter of claim 20 wherein said second high reference voltage source is not lower than said first high reference voltage source.

22. The digital-to-analog converter of claim 20 wherein said second low reference voltage source is not higher than said first low reference voltage source.

23. The digital-to-analog converter of claim 18 further comprising a second switching means, said second switching means being effective for coupling the lower-most node of said second resistor string to said first low reference voltage source in response to said second resistor string being connected in parallel to the first resistor located closest to said first low reference voltage source.

24. The digital-to-analog converter of claim 22 wherein said current drain deactivates in response to the actuation of said second switching means.

25. The digital-to-analog converter of claim 18 wherein said first current is substantially similar to said second current.

26. The digital-to-analog converter of claim 25 wherein said digital-to-analog converter has an N-bit resolution subdivided into c-MSBs and f-LSBs where f=N-c, said first resistor string having $2^c$ first resistors of substantially the same magnitude and said second resistor string having $2^f$ second resistors, each of second resistors having a magnitude substantially similar to the magnitude of a first resistor divided by 2 to a predetermined power x, each of said first resistors having a magnitude directly proportional to the voltage difference of said first high reference voltage source and said first low reference voltage source and inversely proportional to the sum of said first current and the current, Ic, in said first resistor string.

27. The digital-to-analog converter of claim 26 wherein the magnitude of each of said first resistors is substantially similar to the difference of said first high reference voltage source and said first low reference voltage source multiplied by the quantity of $(1+2^{x+c-N})$ and divided by the product of $2^c$ and the sum of said first current and Ic.

28. The digital-to-analog converter of claim 26 having a maximum output impedance substantially similar to the magnitude of a first resistor multiplied by the quantity of $(2^c/4+2^{N-c-x}/2)$.

29. The digital-to-analog converter of claim 18 wherein each of said plurality of first resistors has substantially the same voltage step across it, said first current being effective for generating a voltage drop across said second resistors string substantially similar to one of said voltage steps.

30. The digital-to-analog converter of claim 18 wherein said first current is effective for generating a voltage across said second resistor string sufficient for establishing a substantially zero voltage drop across each switch within a selected switch pair coupling said second resistor string in parallel to a corresponding first resistor.

31. The digital-to-analog converter of claim 18 further including a second switching means effective for selectively transferring the voltage at any node with said plurality of second resistors to an output node, said first switching means being responsive to a set of most significant data bits and said second switching means being responsive to a set of least significant data bits.

32. A method of constructing an N-bit digital-to-analog converter comprising:

subdividing said N-bits into c most significant bits and f least significant bits where f=N-c;

coupling $2^c$ first resistors of substantially similar magnitude Rc in series to form a first resistor string;

coupling said first resistor string between a first high reference voltage $V_{REF}$ and a first low reference voltage $V_{REFN}$ to establish a first current Ic within said first resistor string;

coupling $2^f$ second resistors of substantially similar magnitude Rf in series to form a second resistor string;

coupling a current source to supply a second current $I_{BIAS}$ through the entirety of said second resistor string;

coupling a current drain for drawing said second current $I_{BIAS}$ from said second resistor string;

implementing a switch network effective for selectively coupling said second resistor string in parallel to any one of said $2^c$ first resistors.

33. The method of claim 32 wherein the second current $I^{BIAS}$ is selected such that the voltage drop across the entire second resistor string is substantially similar to the voltage drop across one of said $2^c$ first resistors.

34. The method of claim 32 wherein the magnitude Rf of each $2^f$ second resistors is a proportional to a predetermined power x of 2 of the magnitude Rc of a first resistor such that $Rf \approx Rc/2^x$.

35. The method of claim 34 wherein $I_{BIAS}$ is selected to have the following relationship to Ic:

$$I_{BIAS} \approx 2^{x-f} Ic.$$

36. The method of claim 34 wherein said magnitude Rc is selected to have the following relationship:

$$Rc \approx (V_{REFP}-V_{REFN})(1+2^{x+c-N})/(2^c(Ic+I_{BIAS})).$$

37. The method of claim 34 wherein the output impedance of said digital-to-analog converter is substantially similar to $$Rc(2^c/4+2^{N-c-x}/2)$$

and the selected values of c and x are varied to minimize the output impedance.

38. The method of claim 34 wherein the worst-case time constant delay of said digital-to-analog converter is substantially similar to $$Rc(2^c/4+2^{N-c-x}/2)(C_L+C_P)N\ln(2)$$

where $C_L$ is a selected capacitive load and $C_P$ is the parasitic capacitance of said digital-to-analog converter, and the selected values of c and x are varied to minimize the worst-case time constant.

* * * * *

UNITED STATES PATENT AND TRADEMARK OFFICE
CERTIFICATE OF CORRECTION

PATENT NO. : 5,703,588
DATED : December 30, 1997
INVENTOR(S) : Roberto Rivoir, et. al.

It is certified that error appears in the above-identified patent and that said Letters Patent is hereby corrected as shown below:

Col. 4, line 29, "MUXi" should read -- MUX1 --.

Col. 7, line 7, "$Sc_2c_{-1}'/Sc_2{}^{c-1}$" should read -- $Sc_2{}^c{}_{-1}'/Sc_2{}^c{}_{-1}$ --.

Col. 7, line 55, "VSS $\leq$ $V_{REFN}$ $\leq$ $V_{REFP}$ $\leq$ VDD" should read -- VSS $\leq$ $V_{REFN}$ $\leq$ $V_{REFP}$ $\leq$ VDD --.

Col. 7, line 66, "A 12-b Two-Step CMOS A/D Converter" should read -- "A 12-b 5-Msample/s Two-Step CMOS A/D Converter" --.

Col. 8, line 17, "$V_{fstrng}{}^S=$ " should read -- $V_{f\text{-}strg}=$ --.

Col. 12, line 12, "$2^{c1071}-1$" should read -- $2^c-1$ --.

Claim 32, Col. 16, line 8, "$V_{REF}$" should read -- $V_{REFP}$ --.

UNITED STATES PATENT AND TRADEMARK OFFICE
CERTIFICATE OF CORRECTION

PATENT NO. : 5,703,588
DATED : December 30, 1997
INVENTOR(S) : Roberto Rivoir, et. al.

It is certified that error appears in the above-identified patent and that said Letters Patent is hereby corrected as shown below:

Claim 32, Col. 16, line 9, "$V_{REPN}$" should read -- $V_{REFN}$ --.

Claim 33, Col. 16, line 21, "$I^{BIAS}$" should read -- $I_{BIAS}$ --.

Signed and Sealed this

Seventh Day of April, 1998

Attest:

*Attesting Officer*

BRUCE LEHMAN

*Commissioner of Patents and Trademarks*